(12) United States Patent
Monk

(10) Patent No.: US 6,208,179 B1
(45) Date of Patent: Mar. 27, 2001

(54) DIVIDING CIRCUIT AND TRANSISTOR STAGE THEREFOR

(75) Inventor: Trevor Monk, Gwent (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 09/220,978

(22) Filed: Dec. 23, 1998

(30) Foreign Application Priority Data

Dec. 23, 1997 (GB) ................................................ 9727244

(51) Int. Cl.[7] .............................. H03B 19/00; H03L 7/06
(52) U.S. Cl. ............................................. 327/117; 327/156
(58) Field of Search ........................ 327/115–117, 141, 327/146–148, 155–157; 377/47, 48; 375/375–376

(56) References Cited

U.S. PATENT DOCUMENTS

| | | | |
|---|---|---|---|
| 3,749,937 | 7/1973 | Rogers | 307/225 C |
| 4,114,049 | 9/1978 | Suzuki | 307/225 C |
| 4,369,379 | * 1/1983 | Hull | 377/47 |
| 4,389,728 | 6/1983 | Tsuzuki | 377/114 |
| 4,573,176 | * 2/1986 | Yeager | 377/48 |
| 4,953,187 | 8/1990 | Herold et al. | 377/48 |
| 4,965,531 | * 10/1990 | Riley | 377/48 |
| 5,425,074 | 6/1995 | Wong | 377/47 |
| 5,514,990 | * 5/1996 | Mukaine et al. | 327/116 |

FOREIGN PATENT DOCUMENTS

| | | | |
|---|---|---|---|
| 0 746 109A1 | 4/1996 | (EP) | H03K/23/66 |
| 62-026920 | 4/1987 | (JP) | H03K/5/156 |
| WO 90/05413 | 5/1990 | (WO) | H03K/23/54 |

OTHER PUBLICATIONS

Suzuki et al., "Clocked CMOS Calculator Circuitry." *IEEE Journal of Solid–State Circuits* Dec. 1973, pp. 462–469.

\* cited by examiner

*Primary Examiner*—My-Trang Nuton
(74) *Attorney, Agent, or Firm*—Theodore E. Galanthay; Robert Iannucci; Seed IP Law Group, PLLC

(57) ABSTRACT

A dividing circuit comprises a plurality (N) of transistor stages connected in a ring. Each stage comprises a first pair of transistors of a first conductivity type connected in series between a first voltage level and an output node, a second pair of transistors of a second conductivity type connected in series between a second voltage level and said output node, wherein control nodes of a first transistor of each said transistor pair are connected together to provide an input node for the stage, and control nodes of a second transistor of each said transistor pair are connected together to provide a clock node for the stage, wherein the input node of each stage is connected to the output node of a preceding stage whereby an output signal is generated at each of said output nodes, each cycle of the output signal representing N cycles of a clock signal applied to said clock nodes of the stages, the output signal having a duty cycle that is closer to 50% than a duty cycle of said clock signal.

18 Claims, 7 Drawing Sheets

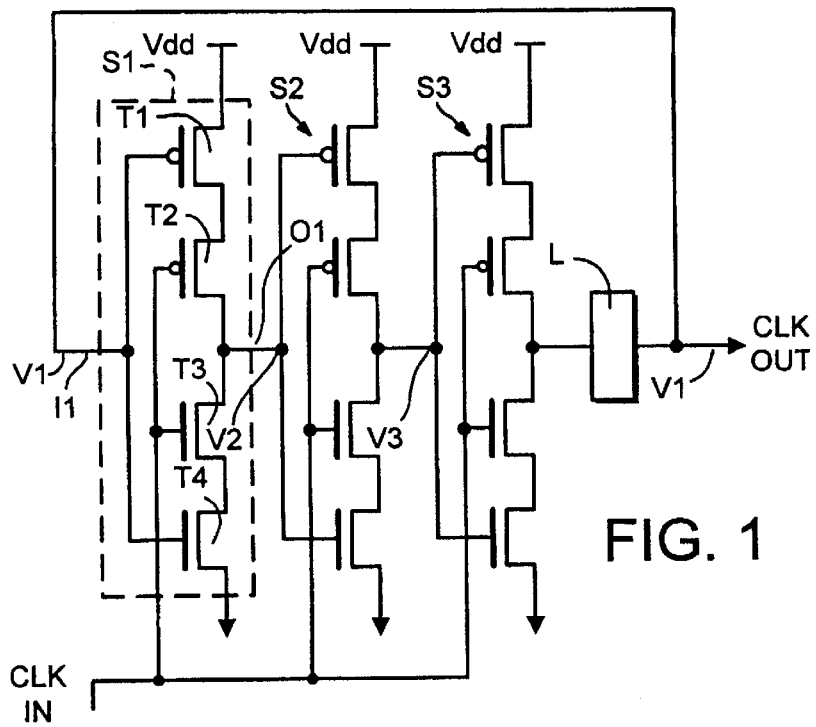
FIG. 1
FIG. 2
| IN (I1) | CLK | OUT (O1) |
|---|---|---|
| 0 | 0 | Vdd |
| 0 | 1 | FLOAT |
| 1 | 0 | FLOAT |
| 1 | 1 | GND |
FIG. 3
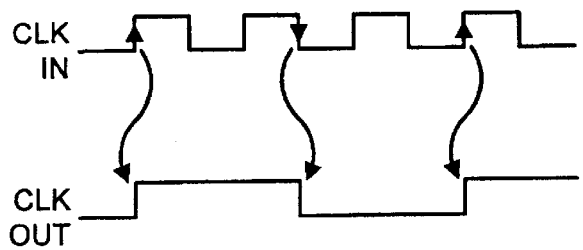
FIG. 4

DIVIDING CIRCUIT AND TRANSISTOR STAGE THEREFOR

TECHNICAL FIELD

This invention relates to a divider circuit, particularly but not exclusively for dividing by odd integers, and to a transistor stage therefor.

BACKGROUND OF THE INVENTION

Clock divider circuits are useful in a number of applications, particularly in counters, where a complete cycle of an output signal represents a predetermined number of incoming clock cycles. The cycles of the output signal can be used to "count" the incoming clock cycles.

It is desirable for such clock divider circuits to work at low power and at high frequencies. For example, desired operating parameters might be a current consumption of 10 $\mu$A at a supply voltage of 3.3 V, with an operating frequency of around 100 MHz. It is also desirable that such divider circuits consume a minimum amount of silicon when implemented on an integrated circuit.

Existing counters are generally based on binary counters. As the basic unit for a binary counter is a divide-by-two unit, extra logic is required to implement counts by odd numbers. This extra logic reduces the highest operating frequency obtainable by the counting circuit and also consumes chip area. Moreover, existing binary counters rarely produce an output signal which has a 50% duty cycle.

Signals having a 50% duty cycle are particularly desirable because in such signals, there is the maximum possible time for the rising and falling edges to achieve safe logic levels. This reduces pulse shrinkage and the consequent uncertainties, both in terms of amplitude and timing of the signal. Moreover, some circuits use both the rising and falling edges of a clock signal, so that it provides greater design flexibility to have a timing point midway through a clock cycle.

The present invention provides a dividing circuit which exhibits an improvement in operating frequency with reduced silicon consumption, particularly for dividing by an odd integer, referred to by N herein.

SUMMARY OF THE INVENTION

According to one aspect of the present invention there is provided a transistor stage for a dividing circuit, the stage comprising:
a first pair of transistors of a first conductivity type connected in series between a first voltage level and an output node;
a second pair of transistors of a second conductivity type connected in series between a second voltage level and said output node,
wherein control nodes of a first transistor of each said transistor pair are connected together to provide an input node for the stage, and
control nodes of a second transistor of each said transistor pair are connected in common to provide a clock node for the stage.

Although two "pairs" of transistors are referred to, there is no need for the transistors to be matched, or otherwise be dependent on one another in their operating parameters.

In the described embodiment, the first transistors are directly connected to the respective first and second voltage levels, and the second transistors are directly connected between the first transistors and the output node. This provides a simple transistor configuration which does not consume an excessive amount of silicon in an integrated circuit yet which provides a high frequency, low power operating transistor stage. In an environment where the first voltage level is a power supply voltage for the stage and the second voltage level is ground, the first pair of transistors are PMOS transistors and the second pair of transistors are NMOS transistors.

Another aspect of the present invention provides a dividing circuit comprising a plurality (N) of transistor stages connected in a ring, each stage comprising:
a first pair of transistors of a first conductivity type connected in series between a first voltage level and an output node;
a second pair of transistors of a second conductivity type connected in series between a second voltage level and said output node,
wherein control nodes of a first transistor of each said transistor pair are connected together to provide an input node for the stage, and control nodes of a second transistor of each said transistor pair are connected together to provide a clock node for the stage,
wherein the input node of each stage is connected to the output node of a preceding stage whereby an output signal is generated at each of said output nodes, each cycle of the output signal representing N cycles of a clock signal applied to said clock nodes of the stages, the output signal having a duty cycle that is closer to 50% than a duty cycle of said clock signal.

In the embodiment described herein, N is an odd integer. The circuit is particularly useful as a divide-by-three or divide-by-five circuit, where N is three or five respectively. However, the number of transistor stages can be extended to any number. It is for counting with such small odd integers that the circuit of the present invention represents a considerable improvement over existing binary counters and necessary associated logic.

The dividing circuit described herein can operate at low powers, for example drawing a current of less than 10 $\mu$A at a supply voltage of 3.3 V and can operate up to high frequencies. It is envisaged that operation up to a frequency of 1 GHz is possible, limited only by the characteristics of a single CMOS transistor.

For a better understanding of the present invention and to show how the present invention may be carried into effect, reference will now be made by way of example to the accompanying drawings and detailed description.

BRIEF DESCRIPTION OF THE DRAWINGS

FIG. 1 illustrates a circuit diagram of a divide-by-three circuit.

FIG. 2 illustrates input and output signals for a divide-by-three circuit such as that shown in FIG. 1.

FIG. 3 illustrates a truth table of each stage of the divide-by-three circuit of FIG. 1.

FIG. 4 illustrates in tabular form a sequence of logic changes on nodes of a divide-by-three circuit such as that shown in FIG. 1.

DETAILED DESCRIPTION OF THE INVENTION

Figure 5A:
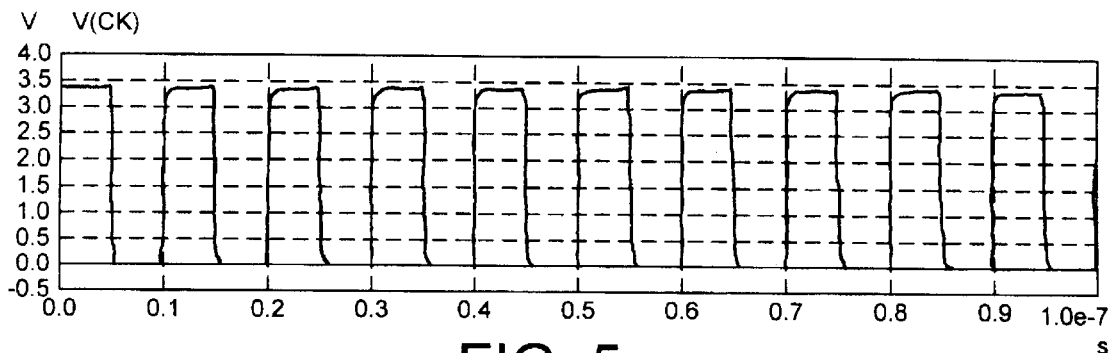
FIGS. 5a to 5d illustrate representations of input and output signals in operation of a divide-by-three circuit such as that shown in FIG. 1, where the input signal has a 50% duty cycle.

FIG. 1 illustrates a divide-by-three (divider) circuit which comprises three stages S1, S2, and S3 connected in a ring with an input node of each stage connected to an output node of a preceding stage. Each stage comprises a first pair of p-channel MOS transistors T1, T2 and a second pair of n-channel MOS transistors T3, T4. Only the first stage S1 is described in detail herein, the remaining stages being the same. The transistors T1, T2 of the first pair are connected in series between a supply voltage Vdd and an output node O1. The transistors T3, T4 of the second pair are connected in series between the output node O1 and ground. The gate of the outermost transistor of each pair T1, T4 is connected to an input node I1 for the stage S1. The gates of the inner two transistors T2, T3 are connected to receive an input clock signal CLK IN and form a clock node for the stage.

S2 and S3 represent similar stages, each of which have an outer set of transistors connected to an input node for the stage and an inner set of transistors connected to the input clock signal CLK IN. An output signal may be taken from the divider circuit at the output node of any of the stages, but in FIG. 1, a single output signal CLK OUT is shown for convenience at the output of the third stage S3.

As shown in FIG. 2, the divider circuit represents a divide-by-three counter. That is, one cycle of the output signal CLK OUT represents three cycles of the input clock signal CLK IN. To achieve this, the divider circuit causes a change in state in the output signal CLK OUT which is dependent not only on a clock edge, but also on a logical state of data preceding the clock edge. In this context, the data is the signal applied to the input node of a stage S1, S2, or S3 from the preceding stage. There follows an explanation as to how the divider circuit of FIG. 1 achieves this.

FIG. 3 represents the truth table for each stage S1, S2, and S3 of the divider circuit. Considering the stage S1, when the voltage at the input node I1 has logic state zero, transistor T4 is off and transistor T1 is turned on. In this situation, when the input clock signal CLK IN has a logic state of zero, transistor T2 is likewise turned on, creating a current path which allows the output node O1 to be pulled up to Vdd, as shown in the first line of the truth table of FIG. 3. However, when the input clock signal CLK IN has a logic state of one, the transistor T2 is turned off with the consequence that the output node O1 "floats" at the logic state it held previously. That is, the output node O1 represents a high impedance state to the subsequent stage and is not driving any output current.

When the voltage at the input node I1 is in logic state one, the transistor T1 is turned off and the transistor T4 is turned on. Now, with the input clock signal CLK IN at logic state zero, the transistor T3 remains off and so the output node O1 floats. When the logic state of the input clock signal CLK IN changes to a one, the transistor T3 is turned on to create a current path allowing the transistors T3 and T4 to pull the output node O1 down to ground.

The effect of this around the ring can be seen with reference to FIG. 4. Because there is an odd number of stages S1, S2, and S3 in the ring, it is inevitable that before each edge of the incoming input clock signal CLK IN, two consecutive stages will have the same logic level on their outputs. In an initial state discussed in FIG. 4, the nodes marked V1 and V3 both have a zero logic state. When the incoming input clock signal CLK IN changes state, the second of these logic states in the ring (at V1 in the example of FIG. 4) which was floating at a zero is forced to change its state to a one. Thus, the inputs of stages S1 and S2 (marked as V1 and V2) now have the same logic level one. On the next change of state of the input clock signal CLK IN, the state of an input signal at the input node I1 is logic level one and the state of the input clock signal CLK IN is logic level one, which drives the state of the output node O1 (marked as V2 in FIG. 4) from its preceding floating state of a logic level one to a logic level zero. This sequence continues, resulting in the repeating cycle marked as R in FIG. 4, which is represented by the output waveform in FIG. 2.

Initialization is not required to start the divider circuit. It will self-start within a few cycles of the input signal as a result of small asymmetries in the layout. However, initialization circuitry may be added if desired to force a particular initial state. It will readily be appreciated that logic circuitry such as that marked as L in FIG. 1 may be inserted between any two sequential stages of the ring, provided that the logic circuitry L is not inverting.

Power consumption of the divider circuit is very low compared with existing divider circuits. One reason for this is that only one internal node changes state on each clock edge, so that the power consumption is dominated by the charge/discharge currents of the capacitance of a single node. Moreover, the maximum operating frequency of the divider circuit can be very high, because the delay introduced by each stage S1, S2, or S3 is only that introduced by a single transistor. In other words, each stage S1, S2, or S3 only comprises one "layer" of transistor logic requiring a change in state between input and output.

Figure 5B:
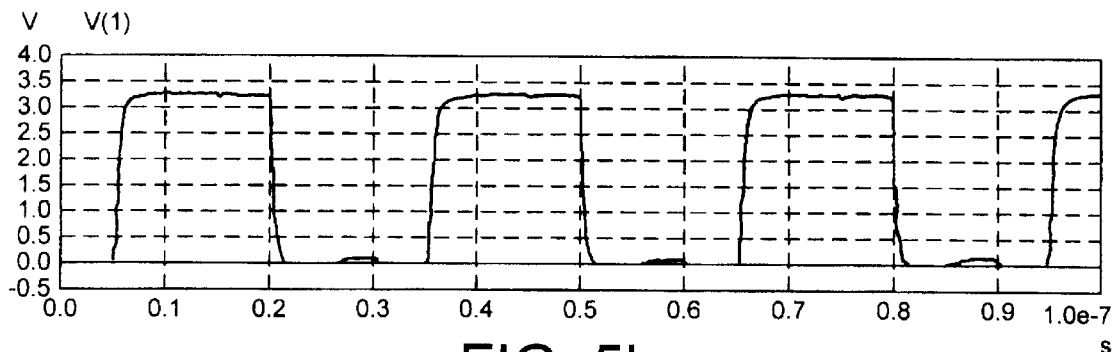
Figure 5C:
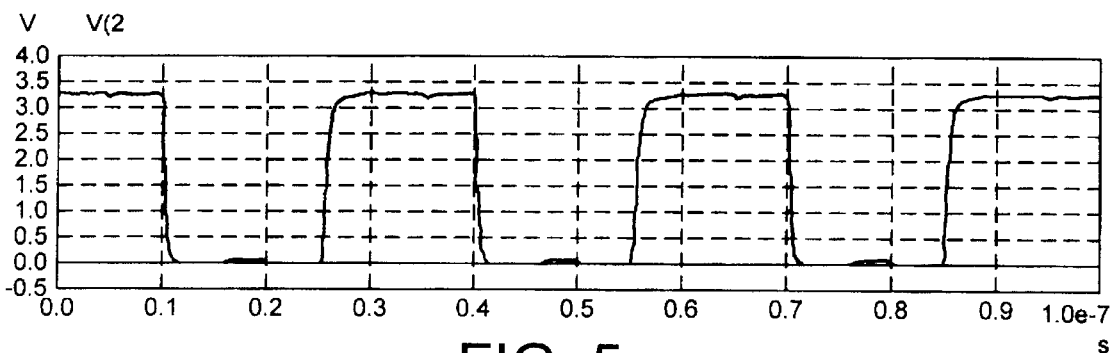
Figure 5D:
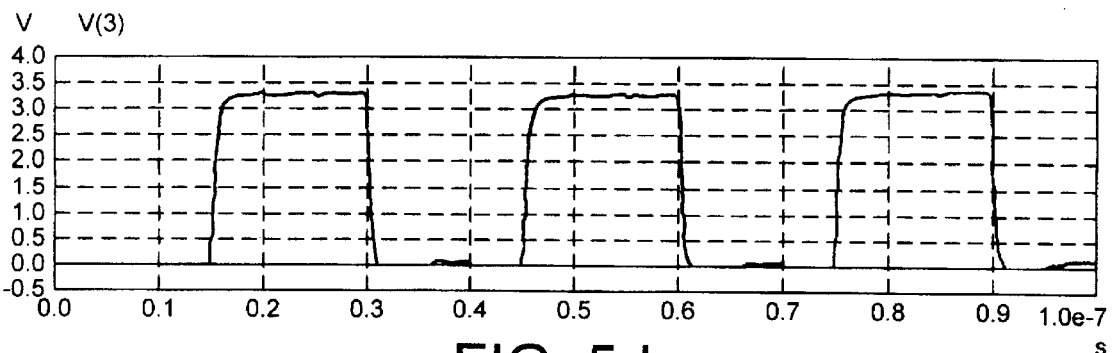

The divider circuit of FIG. 1 has the useful property of maintaining a duty cycle of 50% in the output signal if the input signal has a duty cycle of 50%. FIG. 5a represents the input waveform at a duty cycle of 50%. FIGS. 5b to 5d represent the output waveforms at the nodes marked V1, V2, and V3 in FIG. 1 respectively. As can be seen from FIGS. 5a to 5d, when the input clock signal CLK IN has a duty cycle of 50%, the output waveform of each stage S1, S2, or S3 also has a duty cycle of 50%. Furthermore, the output waveform of each stage S1, S2, or S3 has a specific and predictable phase relationship with the output waveform of other stages, providing the designer with great flexibility concerning applications of the divider circuit.

Figure 6A:
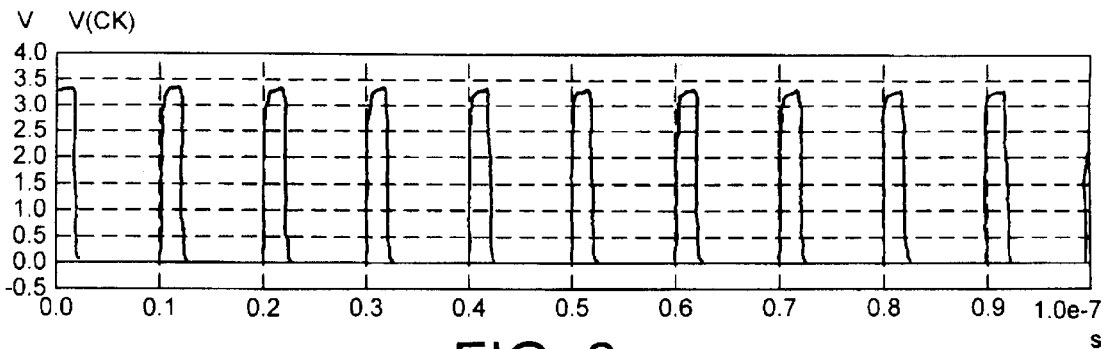
FIGS. 6a to 6d illustrate representations of input and output signals for a divide-by-three circuit such as that shown in FIG. 1, where the input signal has a 20% duty cycle.
Figure 6B:
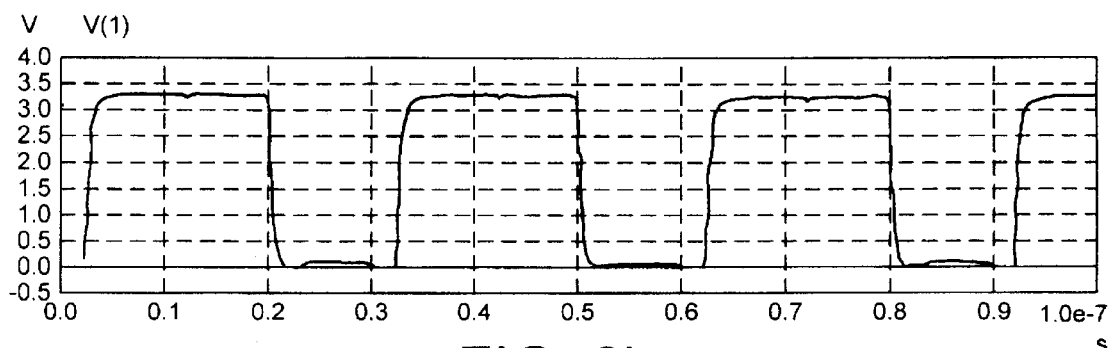
Figure 6C:
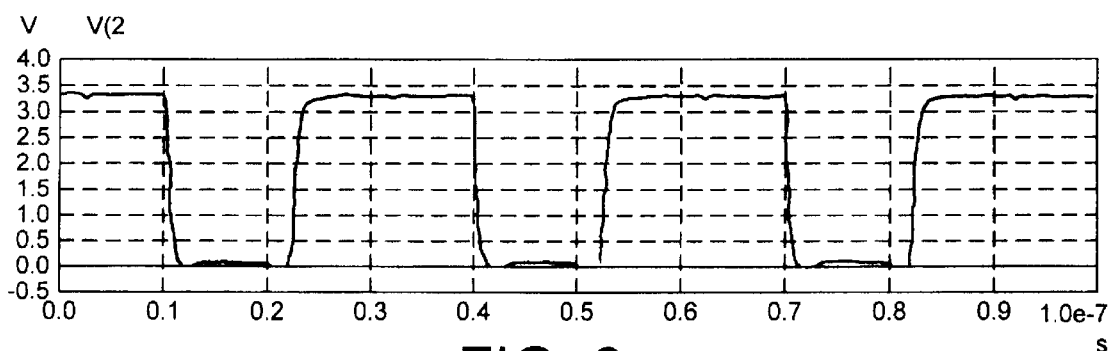
Figure 6D:
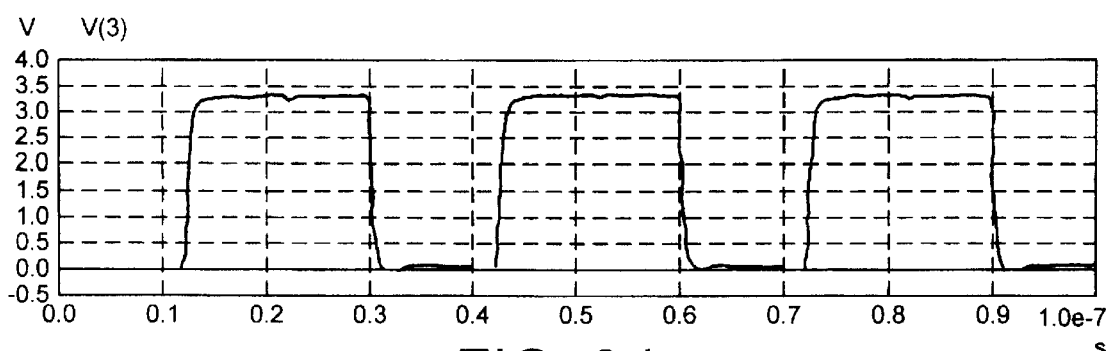

The divider circuit also has the property of "improving" the duty cycle of the input clock signal CLK IN, where the duty cycle is not 50%. The manner of operation of the divider circuit ensures that an output signal always has a duty cycle closer to 50% than the input clock signal CLK IN. If the percentage difference from 50% of the duty cycle of the incoming input clock signal CLK IN is designated $\Delta_{IN}$, the difference from $\Delta_{OUT}$ from 50% of the duty cycle in the output signal is $\Delta_{IN}$ divided by N, where N is the number of stages in the dividing circuit. Thus, the "error" in the duty cycle is reduced by the number of stages in the divider circuit ring. An example of this is shown for the divide-by-three circuit of FIG. 1 in the waveforms of FIGS. 6a to 6d. FIG. 6a represents the input clock signal CLK IN having a duty cycle of 20%. FIG. 6b to 6d represent the output signals at each of the output nodes V1 to V3, from which it can readily be seen that the duty cycle of the output signal at any of the nodes is 60%. That is, according to the above calculation $$A_{OUT} = \frac{[50 - 20]}{3} = 10\%.$$

Figure 7:
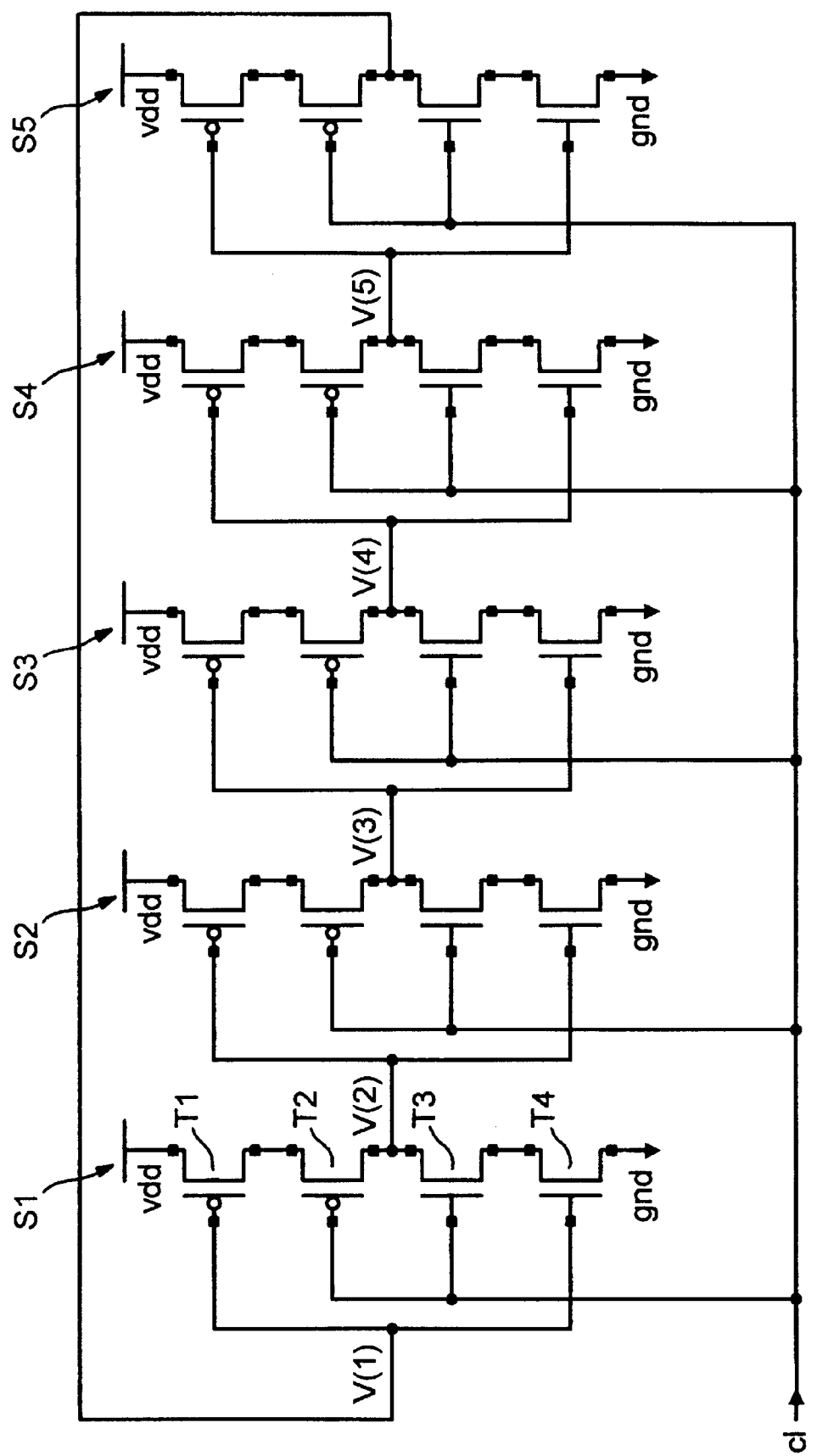
FIG. 7 illustrates a circuit diagram of a divide-by-five circuit.
Figure 8A:
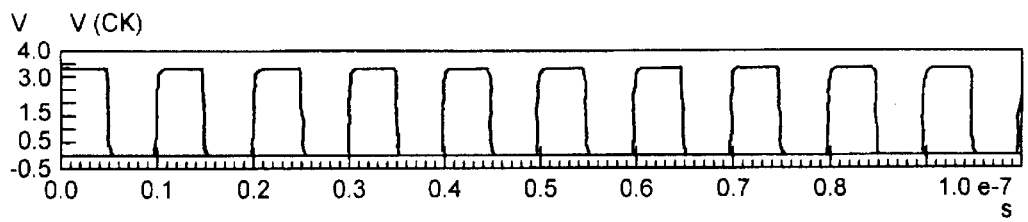
FIGS. 8a to 8f illustrate representations of input and output waveforms for a divide-by-five circuit such as that shown in FIG. 7, where the input clock signal has a 50% duty cycle.
Figure 8B:
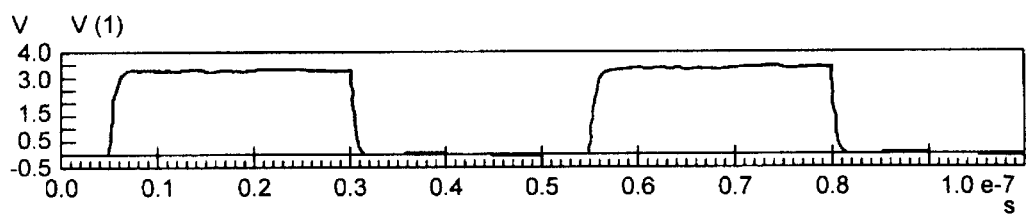
Figure 8C:
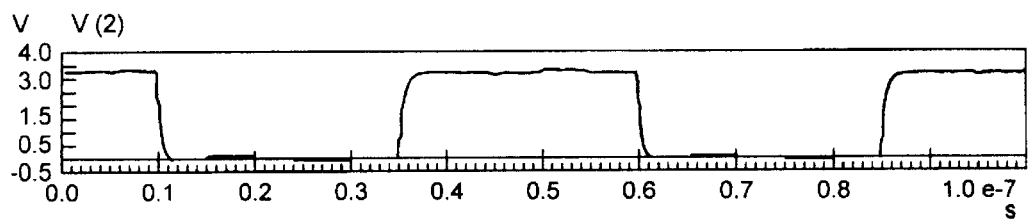
Figure 8D:
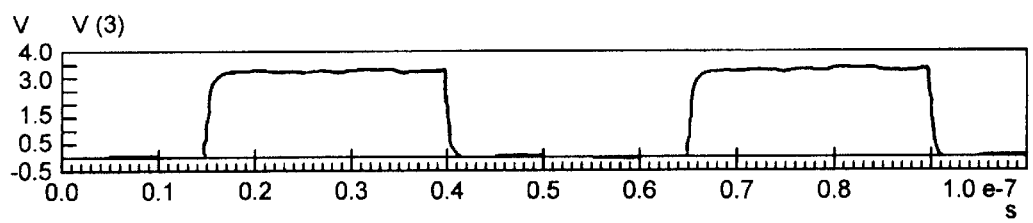
Figure 8E:
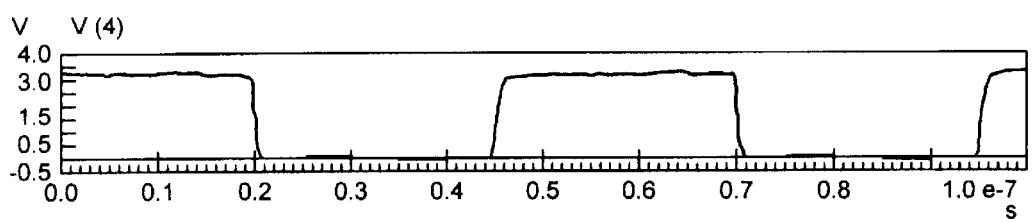
Figure 8F:
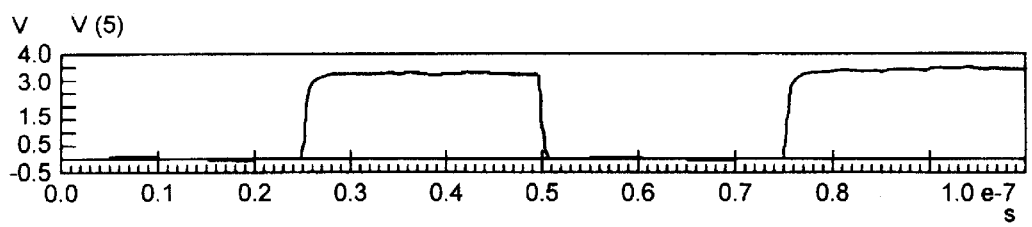

The principle of the divide-by-three circuit illustrated in FIG. 1 and described above can readily be extended to other odd numbers, e.g., 5,7,9 etc. FIG. 7 is a circuit diagram of a divide-by-five circuit, having five stages S1 to S5, each stage having the transistor configuration described with reference to FIG. 1. FIGS. 8a to 8f represent the waveforms for the circuit of FIG. 7. FIG. 8a represents the input signal at a 50% duty cycle, and FIGS. 8b to 8f represent the output signals at each output nodes V1 to V5.

Figure 9:
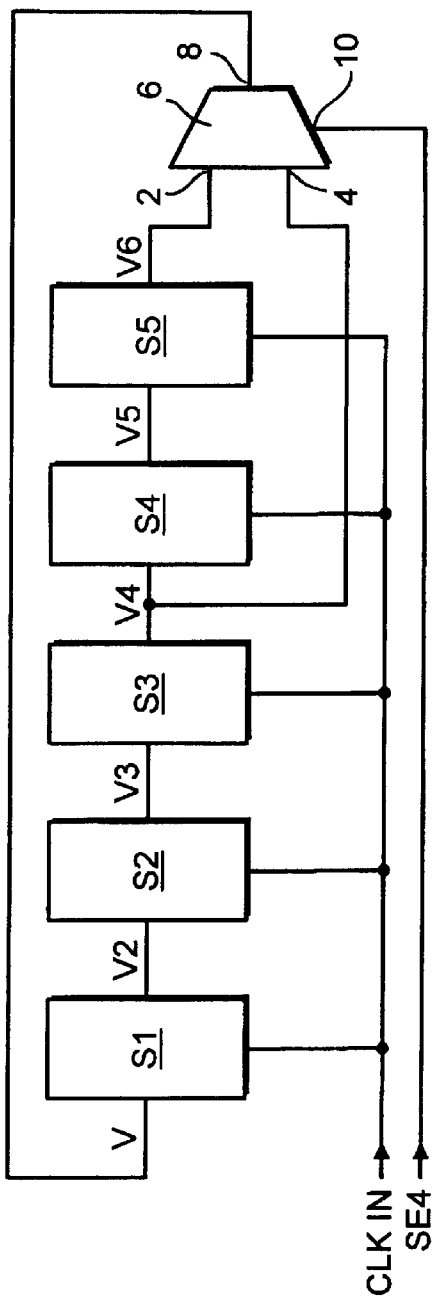
FIG. 9 illustrates a programmable dividing circuit.

FIG. 9 illustrates how a programmable dividing circuit may be constructed to divide by a selected odd integer. FIG. 9 illustrates a programmable dividing circuit which can selectively divide by three or by five. The transistor configuration of each stage S1 to S5 is not shown in FIG. 9 but is the same as for FIG. 7. A divide-by-five circuit is constructed as illustrated in FIG. 7. However, instead of connecting the output V6 of the last transistor stage S5 to the input of the first transistor stage S1 directly, the output V6 of the fifth transistor stage S5 is supplied to one input 2 of a multiplexer 6. The output V4 of the third transistor S3 stage is supplied to the other input 4 of the multiplexer 6.

An output 8 of the multiplexer 6 is connected to the input node of the first transistor stage S1 and also provides the output signal CLK OUT. A select input 10 receives a select signal SEL which controls whether the output V4 of the third transistor stage S3 or the output V6 of the fifth transistor stage S5 is supplied to the first transistor stage S1 and also serves as the output for the circuit. It will be appreciated that any suitable multiplexer could be used to selectively supply the output of the third stage S3 or fifth stage S5 as the input to the first transistor stage S1.

Figure 10A:
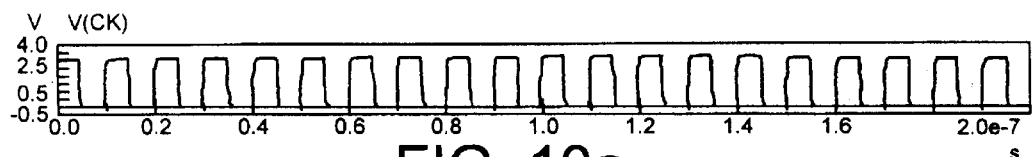
FIGS. 10a to 10b show waveforms illustrating operation of a dividing circuit such as that shown in FIG. 9.
Figure 10B:
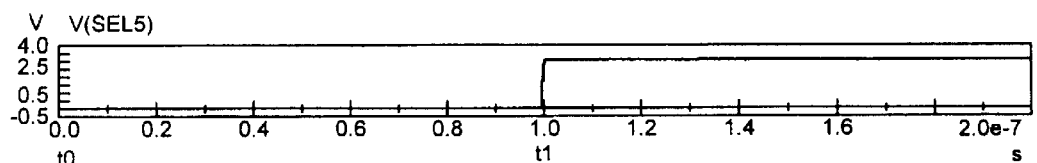
Figure 10C:
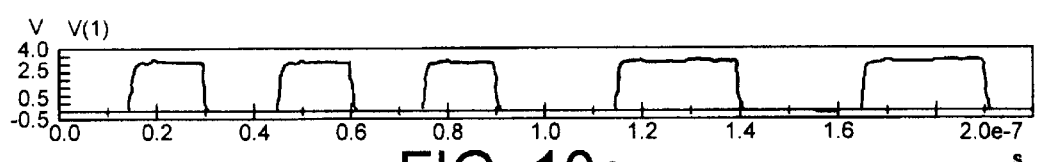
Figure 10D:
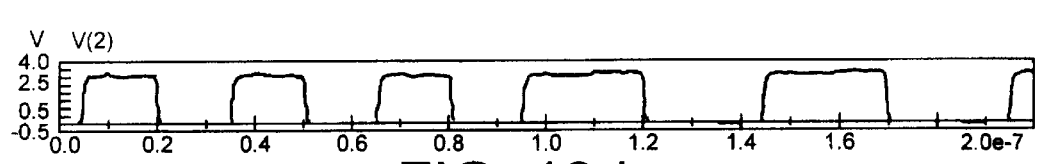
Figure 10E:
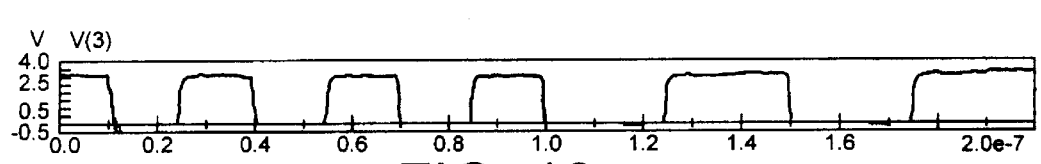
Figure 10F:
Figure 10G:
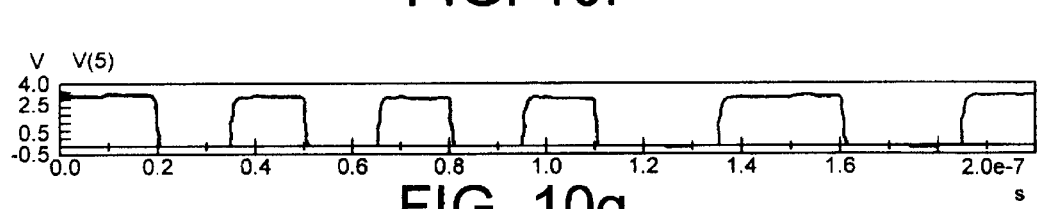
Figure 10H:
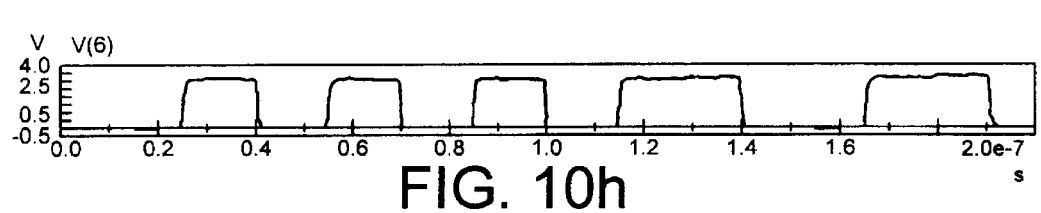

FIG. 10 illustrates operation of the circuit of FIG. 9 with an input signal CLK IN having a 50% duty cycle as illustrated in FIG. 10a. FIG. 10b illustrates the state of the select signal SEL supplied to the select input 10 of the multiplexer 6. At time t0, the select signal SEL is low, causing the first input 4 of the multiplexer 6 to be supplied to its output 8 and thus connecting in a ring the three transistor stages S1, S2, and S3. The circuit thus operates as a divide-by-three circuit, as can be seen from the output waveforms between time t0 and t1 in FIGS. 10c to 10h. At time t1, the select signal SEL goes high, thus connecting the second input 2 to the output 8 of the multiplexer 6. In this case therefore, the five transistor stages S1 to S5 are connected in a ring so that the circuit operates as a divide-by-five circuit, as can be seen from the waveforms in FIGS. 10c to 10h after time t1.

As can be seen from the waveforms in FIG. 10, it is possible to change the dividing integer N "on the fly" by appropriately selecting the time at which the state of the select input is changed.

It will readily be appreciated that the principle illustrated above with respect to a programmable divide-by-three/divide-by-five circuit can be applied to any selected odd numbers by appropriately selecting the transistor stages whose outputs are supplied to the multiplexer 6. Moreover, it is possible to construct a circuit which can selectively divide by three or more odd integers by having a multiplexer 6 with three or more inputs to which the outputs of the appropriate transistor stages are supplied.

Figure 11:
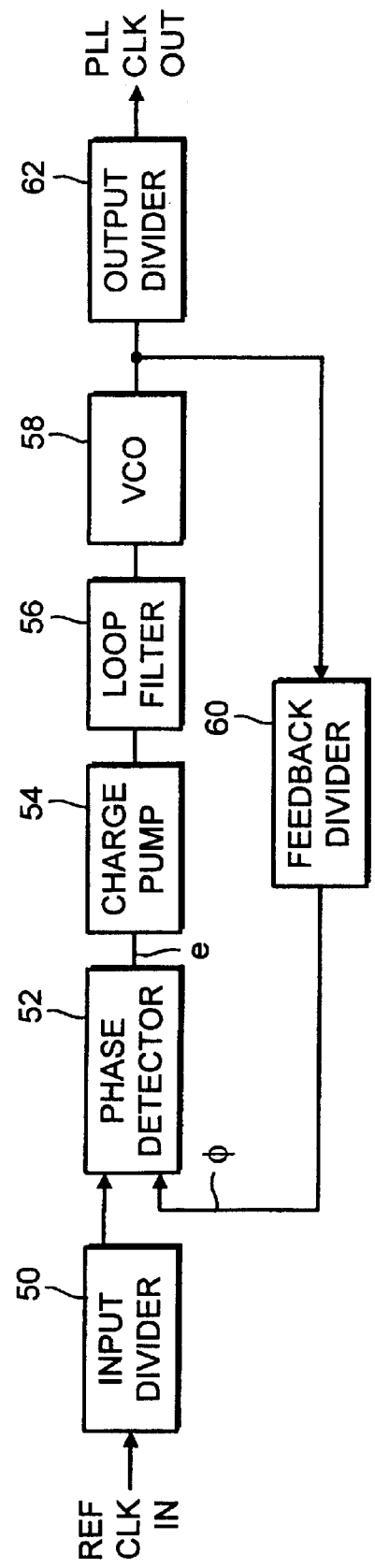
FIG. 11 illustrates a block diagram of a phase-locked-loop circuit.

FIG. 11 is a diagram of a basic phase-locked-loop circuit in which the dividing circuits described herein are particularly useful. The phase-locked-loop circuit receives a reference clock input REF CLK IN and generates a PLL clock output PLL CLK OUT. An input divider 50 creates from the reference clock input REF CLK IN a reference input frequency for a phase detector 52. The phase detector 52 also receives as an input a feedback signal φ generated in a manner described in the following. An error output e is generated according to the relative phase of the reference signal and the feedback signal φ and is supplied to a charge pump 54. A loop filter 56 shapes the output of the charge pump 54 and generates a correction signal for a voltage controlled oscillator 58. The output of the voltage controlled oscillator 58 is passed through a feedback divider 60 to generate the second input (feedback signal φ) to the phase detector 52. The output of the voltage controlled oscillator 58 is also passed through an output divider 62 to generate the clock output PLL CLK OUT.

A dividing circuit in accordance with the present invention can usefully be used to implement any of the input divider 50, feedback divider 60, or output divider 62 to provide a phase-locked-loop satisfying required technology, frequency and power constraints.

From the foregoing, it will be appreciated that although specific embodiments of the invention have been described herein for purposes of illustration, various modifications may be made without deviating from the spirit and scope of the invention. Accordingly, the invention is not limited except as by the appended claims, the interpretation of which are to be made in accordance with established doctrines of claim interpretation.

What is claimed is:

1. A dividing circuit comprising a plurality (N) of transistor stages connected in a ring, each stage comprising:

a first pair of transistors of a first conductivity type connected in series between a first voltage level and an output node;

a second pair of transistors of a second conductivity type connected in series between a second voltage level and said output node, wherein control nodes of a first transistor of each said transistor pair are connected together to provide an input node for the stage, and control nodes of a second transistor of each said transistor pair are connected together to provide a clock node for the stage, wherein the input node of each stage is connected to the output node of a preceding stage whereby an output signal is generated at each of said output nodes, each cycle of the output signal representing N cycles of a clock signal applied to said clock nodes of the stages, the output signal having a duty cycle that is closer to 50% than a duty cycle of said clock signal;

and further comprising a switching circuit that selectively connects one of at least two inputs to an output, wherein the output nodes of at least two alternate transistor stages of the dividing circuit are connected respectively to said at least two inputs, wherein one of said output nodes is selectively connected to the input node of a subsequent stage so that the integer N is programmable.

2. The dividing circuit according to claim 1 wherein N is odd.

3. The dividing circuit according to claim 2 wherein N is nine or less.

4. The dividing circuit according to claim 2 wherein N is five.

5. The dividing circuit according to claim 1 wherein the first transistors of each stage are directly connected to the respective first and second voltage levels and the second transistors of each stage are directly connected between said first transistors and said output node.

6. The dividing circuit according to claim 1 wherein the first voltage level is a power supply voltage for the dividing circuit and the second voltage level is ground.

7. The dividing circuit according to claim 6 wherein the first pair of transistors are p-channel CMOS transistors and the second pair of transistors are n-channel CMOS transistors.

8. The dividing circuit according to claim 1 wherein the switching circuit has a select input to receive a select signal to program said integer N by selectively connecting one of said at least two inputs of the switching circuit to the output of the switching circuit.

9. A dividing circuit comprising a plurality (N) of transistor stages connected in a ring, each stage comprising:
a first pair of transistors of a first conductivity type connected in series between a first voltage level and an output node;
a second pair of transistors of a second conductivity type connected in series between a second voltage level and said output node,
wherein control nodes of a first transistor of each said transistor pair are connected together to provide an input node for the stage, and control nodes of a second transistor of each said transistor pair are connected together to provide a clock node for the stage,
wherein the input node of each stage is connected to the output node of a preceding stage whereby an output signal is generated at each of said output nodes, each cycle of the output signal representing N cycles of a clock signal applied to said clock nodes of the stages, the output signal having a duty cycle that is closer to 50% than a duty cycle of said clock signal; and
further comprising a noninverting logic circuit connected between at least two sequential ones of said transistor stages.

10. A phase-locked-loop circuit, comprising:
a phase detector having a first input for receiving a reference signal and a second input for receiving a feedback signal, the phase detector being operable to generate an error signal according to the relative phase of the reference signal and the feedback signal;
a voltage controlled oscillator connected to receive a signal representative of the error signal generated by the phase detector; and
a dividing circuit connected to receive an output from the voltage controlled oscillator and to divide the output by a predetermined integer to generate the feedback signal, the dividing circuit comprising:
a plurality (N) of transistor stages connected in a ring, each stage having an input node, an output node, and a clock node, wherein the input node of each stage is connected to the output node of a preceding stage whereby an output signal is generated at each of said output nodes, each cycle of the output signal representing N cycles of a clock signal applied to said clock nodes of the stages, the output signal having a duty cycle that is closer to 50% than a duty cycle of said clock signal; and
a switching circuit that selectively connects one of at least two inputs to an output, wherein the output nodes of at least two alternate transistor stages of the dividing circuit are connected respectively to said at least two inputs, wherein one of said output nodes is selectively connected to the input node of a subsequent stage so that the integer N is programmable.

11. A phase-locked-loop circuit, comprising:
a phase detector having a first input to receive a reference signal and a second input to receive a feedback signal, the phase detector being operable to generate an error signal according to the relative phase of the reference signal and the feedback signal;
a voltage controlled oscillator connected to receive a signal representative of the error signal generated by the phase detector;
a dividing circuit connected to receive an output from the voltage controlled oscillator and to divide the output by a predetermined integer to generate the feedback signal; and
an input divider for dividing the reference signal prior to the phase detector, the input divider comprising a plurality (N) of transistor stages connected in a ring, each stage comprising:
a first pair of transistors of a first conductivity type connected in series between a first voltage level and an output node;
a second pair of transistors of a second conductivity type connected in series between a second voltage level and said output node,
wherein control nodes of a first transistor of each said transistor pair are connected together to provide an input node for the stage, and control nodes of a second transistor of each said transistor pair are connected together to provide a clock node for the stage,
wherein the input node of each stage is connected to the output node of a preceding stage whereby an output signal is generated at each of said output nodes, each cycle of the output signal representing N cycles of a clock signal applied to said clock nodes of the stages, the output signal having a duty cycle that is closer to 50% than a duty cycle of said clock signal.

12. A phase-locked-loop circuit, comprising:
a phase detector having a first input to receive a reference signal and a second input to receive a feedback signal, the phase detector being operable to generate an error signal according to the relative phase of the reference signal and the feedback signal;
a voltage controlled oscillator connected to receive a signal representative of the error signal generated by the phase detector;
a dividing circuit connected to receive an output from the voltage controlled oscillator and to divide the output by a predetermined integer to generate the feedback signal; and
an output divider connected to receive the output from the voltage controlled oscillator to generate a divided output signal, the output divider comprising a plurality (N) of transistor stages connected in a ring, each stage comprising:
a first pair of transistors of a first conductivity type connected in series between a first voltage level and an output node;

a second pair of transistors of a second conductivity type connected in series between a second voltage level and said output node, wherein control nodes of a first transistor of each said transistor pair are connected together to provide an input node for the stage, and control nodes of a second transistor of each said transistor pair are connected together to provide a clock node for the stage, wherein the input node of each stage is connected to the output node of a preceding stage whereby an output signal is generated at each of said output nodes, each cycle of the output signal representing N cycles of a clock signal applied to said clock nodes of the stages, the output signal having a duty cycle that is closer to 50% than a duty cycle of said clock signal.

13. A dividing circuit having a plurality (N) of transistor stages, wherein N is an odd integer, each stage comprising:

a first pair of transistors of a first conductivity type connected in series between first voltage level and an output node;

a second pair of transistors of a second conductivity type connected in series between a second voltage level and the output node, wherein control nodes of a first transistor of each transistor pair are connected together to provide an input node for the stage and control nodes of a second transistor of each transistor pair are connected together to provide a clock node for the stage, the stages being serially connected in a ring to connect the input node of each stage to the output node of a preceding stage, whereby application of a clock signal to the clock node of each stage generates an output signal at each of the output nodes, the output signal having a cycle substantially equal to N cycles of the clock signal and a duty cycle closer to 50% than a duty cycle of the clock signal; and a switching circuit to selectively connect one of two inputs to an output, the output nodes of two alternate stages of the dividing circuit connected respectively to the two inputs, the switching circuit connecting the one of the two inputs to the output to change the integer N of transistor stages in the dividing circuit.

14. The dividing circuit of claim 13 wherein the first transistors of each stage are directly connected to the respective first and second voltage levels and the second transistors of each stage are directly connected between the first transistors and the output node.

15. The dividing circuit of claim 13 wherein the first voltage level is a power supply voltage for the dividing circuit and the second voltage level is ground such that application of a logic zero voltage to the input node of one stage drives the output signal at the output node of the one stage towards the power supply voltage if the clock signal is at logic zero voltage, the output signal at the output node of the one stage floating substantially at an existing voltage level if the clock signal is at logic one voltage.

16. The dividing circuit of claim 13 wherein the first voltage level is a power supply voltage for the dividing circuit and the second voltage level is ground such that application of a logic one voltage to the input node of one stage drives the output signal at the output node of the one stage towards ground if the clock signal is at logic one voltage, the output signal at the output node of the one stage floating substantially at an existing voltage level if the clock signal is at logic zero voltage.

17. A phase-locked-loop circuit, comprising:

a phase detector having a first input to receive a reference signal and a second input to receive a feedback signal, the phase detector being operable to generate an error signal according to the relative phase of the reference signal and the feedback signal;

a voltage controlled oscillator connected to receive a signal representative of the error signal generated by the phase detector;

a feedback divider connected to receive an output from the voltage controlled oscillator and to divide the output by a predetermined integer to generate the feedback signal; and an input divider to divide the reference signal prior to the phase detector, wherein the input divider comprises:

a dividing circuit having a plurality (N) of transistor stages, wherein N is an odd integer, each stage comprising:

a first pair of transistors of a first conductivity type connected in series between a first voltage level and an output node; and a second pair of transistors of a second conductivity type connected in series between a second voltage level and the output node, wherein control nodes of a first transistor of each transistor pair are connected together to provide an input node for the stage, and control nodes of a second transistor of each said transistor pair are connected together to provide a clock node for the stage, the stages serially connected in a ring to connect the input node of each stage to the output node of a preceding stage, whereby application of a clock signal to the clock node of each stage generates an output signal at each of the output nodes, the output signal having a cycle substantially equivalent to N cycles of the clock signal and a duty cycle closer to 50% than a duty cycle of the clock signal, the output signal of one stage being the divided reference signal.

18. The phase-locked-loop circuit of claim 17, further comprising:

an output divider connected to receive the output from the voltage controlled oscillator to generate a divided output signal.

* * * * *

UNITED STATES PATENT AND TRADEMARK OFFICE
CERTIFICATE OF CORRECTION

PATENT NO. : 6,208,179 B1  
DATED : March 27, 2001  
INVENTOR(S) : Trevor Monk

Page 1 of 1

It is certified that error appears in the above-identified patent and that said Letters Patent is hereby corrected as shown below:

<u>Title page,</u>  
Item [30], the foreign priority application number should read -- 9727244.7 --.

Signed and Sealed this

Thirteenth Day of November, 2001

Attest:

*Nicholas P. Godici*

Attesting Officer

NICHOLAS P. GODICI  
*Acting Director of the United States Patent and Trademark Office*